(12) United States Patent
Hughes

(10) Patent No.: US 6,897,692 B1
(45) Date of Patent: *May 24, 2005

(54) CHARGE PUMP USING DYNAMIC CHARGE BALANCE COMPENSATION CIRCUIT AND METHOD OF OPERATION

(75) Inventor: Rodney A. Hughes, Tacoma, WA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/736,450

(22) Filed: Dec. 15, 2003

Related U.S. Application Data

(63) Continuation of application No. 10/234,633, filed on Sep. 4, 2002, now Pat. No. 6,664,829.

(51) Int. Cl.[7] .................................................. H03L 7/06
(52) U.S. Cl. ........................................ 327/157; 527/148
(58) Field of Search ................................. 327/148, 157, 327/536, 306, 319; 331/17

(56) References Cited

U.S. PATENT DOCUMENTS

| | | | | |
|---|---|---|---|---|
| 5,508,660 A | * | 4/1996 | Gersbach et al. | 331/17 |
| 6,107,889 A | * | 8/2000 | Strange et al. | 331/17 |
| 6,278,332 B1 | * | 8/2001 | Nelson et al. | 331/17 |
| 6,326,852 B1 | * | 12/2001 | Wakayama | 331/17 |
| 6,526,111 B1 | * | 2/2003 | Prasad | 375/376 |
| 6,642,759 B1 | * | 11/2003 | Hughes | 327/157 |
| 2003/0107420 A1 | * | 6/2003 | Hsu et al. | 327/157 |
| 2004/0071252 A1 | * | 4/2004 | Boerstler | 375/374 |

* cited by examiner

Primary Examiner—Tuan T. Lam

(57) ABSTRACT

A charge pump comprises a first current mirror that injects a first charging current onto a loop filter and a second charging current onto an integrator capacitor. The first and second charging currents are controlled by a first common control signal. The first charging current mirrors the second charging current. A second current mirror drains a first discharging current from the loop filter and a second discharging current from the integrator capacitor. The first and second discharging is currents are controlled by a second common control signal. The first discharging current mirrors the second discharging current. A sampling circuit couples the second charging and discharging currents to the integrator capacitor, which charges or discharges with a difference current between the second charging and discharging currents. A control circuit detects a voltage difference between the loop filter and integrator capacitor and adjusts the first common control signal to minimize the voltage difference.

20 Claims, 2 Drawing Sheets

CHARGE PUMP USING DYNAMIC CHARGE BALANCE COMPENSATION CIRCUIT AND METHOD OF OPERATION

This application is continuation of prior U.S. patent application Ser. No. 10/234,633 filed on Sep. 4, 2002, now U.S. Pat. No. 6,664,829.

The present invention is generally directed to charge pumps for use in phase-locked loops (PLLs) and delay locked loops (DLLs), and more specifically, to an integrated circuit that uses a dynamic charge balance circuit to control the charge current in a charge pump.

BACKGROUND OF THE INVENTION

In recent years, there have been great advancements in the speed, power, and complexity of integrated circuits (ICs), such as application specific integrated circuit (ASIC) chips, radio frequency integrated circuits (RFIC), central processing unit (CPU) chips, digital signal processor (DSP) chips and the like. These advancements have made possible the development of system-on-a-chip (SOC) devices, among other things. A SOC device integrates into a single chip all (or nearly all) of the components of a complex electronic system, such as a wireless receiver (i.e., cell phone, a television receiver, microprocessor, high-speed data transceiver, and the like).

In many integrated circuits, the clock signals that drive an integrated circuit are generated by a frequency synthesizer phase-locked loop (PLL) or a delay locked loop (DLL). PLLs and DLLs are well known to those skilled in the art and have been extensively written about. The dynamic performance of the frequency synthesizer that is used to generated clock signals is dependent on several parameters, including the natural frequency ($F_n$), the damping factor ($D_F$), the crossover frequency ($F_0$) and the ratio of the comparison frequency ($F_c$) to the crossover frequency. The first three parameters depend on the voltage controlled oscillator (VCO) gain ($K_O$), the F/B (N) divider value, the charge pump current ($I_c$), and the loop filter components.

The last parameter (i.e., the ratio of comparison frequency to crossover frequency) is dependent on the input divider (M) value, as well as the frequency of the input clock itself.

The performance of the frequency synthesizer is also is dependent on the performance of the charge pump located in the PLL or DLL. The charge pump pulse timing jitter and pulse amplitude noise both contribute to synthesizer phase noise. A typical charge pump includes circuitry to avoid what is known as the "dead zone." The dead zone occurs at or near the PLL "lock" state when the phase error is very small and the loop gain would otherwise approach zero. To avoid this problem, both the Pump Up current source and the Pump Down current source of a charge pump are turned ON simultaneously for a brief period at the end of each phase detector cycle. However, to reduce charge pump output noise, it is desirable to reduce the ON time of the charge pump output in the "lock" state.

As the simultaneous ON time is reduced, the goal is to balance the injected charge from the Pump Up current source and the Pump Down current source so that a periodic glitch caused by charge imbalance is not injected into the loop filter, thereby causing frequency spurs on the VCO output. This is difficult to do because the transistor devices used in the Pump Up and Pump Down current sources are different channel type devices with different parasitic characteristics. The problem is further exacerbated when the ON time is reduced to lower the phase noise contribution of the charge pump.

Therefore, there is a need in the art for improved frequency synthesizers for use in generating reference frequency signals. In particular, there is a need in the art for improved charge pumps for use in phase-locked loops or delay-locked loops. More particularly, there is a need for charge pumps that minimize the charge current imbalances in lock state.

SUMMARY OF THE INVENTION

To address the above-discussed deficiencies of the prior art, it is a primary object of the present invention to provide an improved charge pump. According to an advantageous embodiment of the present invention, the charge pump comprises: 1) a first current mirror capable of injecting a first charging current, I(U), onto a loop filter coupled to an output of the charge pump and injecting a second charging current, I(U)/M, onto an integrator capacitor, wherein the first and second charging currents are controlled by a first common control signal such that the first charging current mirrors the second charging current by a factor M; and 2) a second current mirror capable of draining a first discharging current, I(D), from the loop filter and draining a second discharging current, I(D)/M, from the integrator capacitor, wherein the first and second discharging currents are controlled by a second common control signal such that the first discharging current mirrors the second discharging current by the factor M. The charge pump further comprises: 3) a sampling circuit capable of coupling the second charging current and the second discharging current to the integrator capacitor so that the integrator capacitor is one of: i) charged and ii) discharged by a difference current between the second charging current and the second discharging current; and 4) a control circuit capable of detecting a voltage difference between a voltage on the loop filter and a voltage on the integrator capacitor, wherein the control circuit is operable to adjust the first common control signal to minimize the voltage difference.

According to one embodiment of the present invention, the first current mirror comprises: 1) a first charging current source capable of injecting the first charging current onto the loop filter; and 2) a second charging current source capable of injecting the second charging current onto the integrator capacitor.

According to another embodiment of the present invention, the second current mirror comprises: 1) a first discharging current source capable of draining the first discharging current from the loop filter; and 2) a second discharging current source capable of draining the second discharging current from the integrator capacitor.

According to still another embodiment of the present invention, the control circuit comprises an amplifier having a non-inverting input coupled to the integrator capacitor and an inverting input coupled to the loop filter.

According to yet another embodiment of the present invention, the first common control voltage is generated on an output of the amplifier.

According to a further embodiment of the present invention, the control circuit, in response to an increase in voltage on the integrator capacitor, adjusts the first common control voltage so that the second charging current is reduced.

According to a still further embodiment of the present invention, the adjustment of the first common control voltage by the control circuit also reduces the first charging current.

According to a yet further embodiment of the present invention, the control circuit, in response to a decrease in voltage on the integrator capacitor, adjusts the first common control voltage so that the second charging current is increased.

In one embodiment of the present invention, the adjustment of the first common control voltage by the control circuit also increases the first charging current.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least town of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
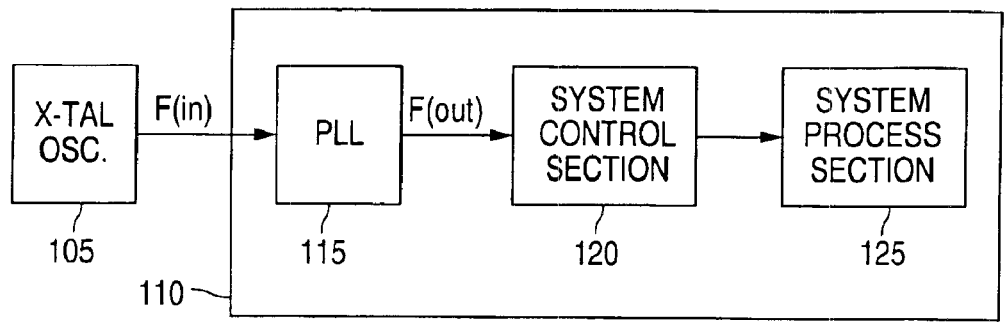
FIG. 1 illustrates an exemplary system-on-a-chip (SOC) device containing a phase-locked-loop (PLL) frequency synthesizer according to one embodiment of the present invention.
Figure 3:
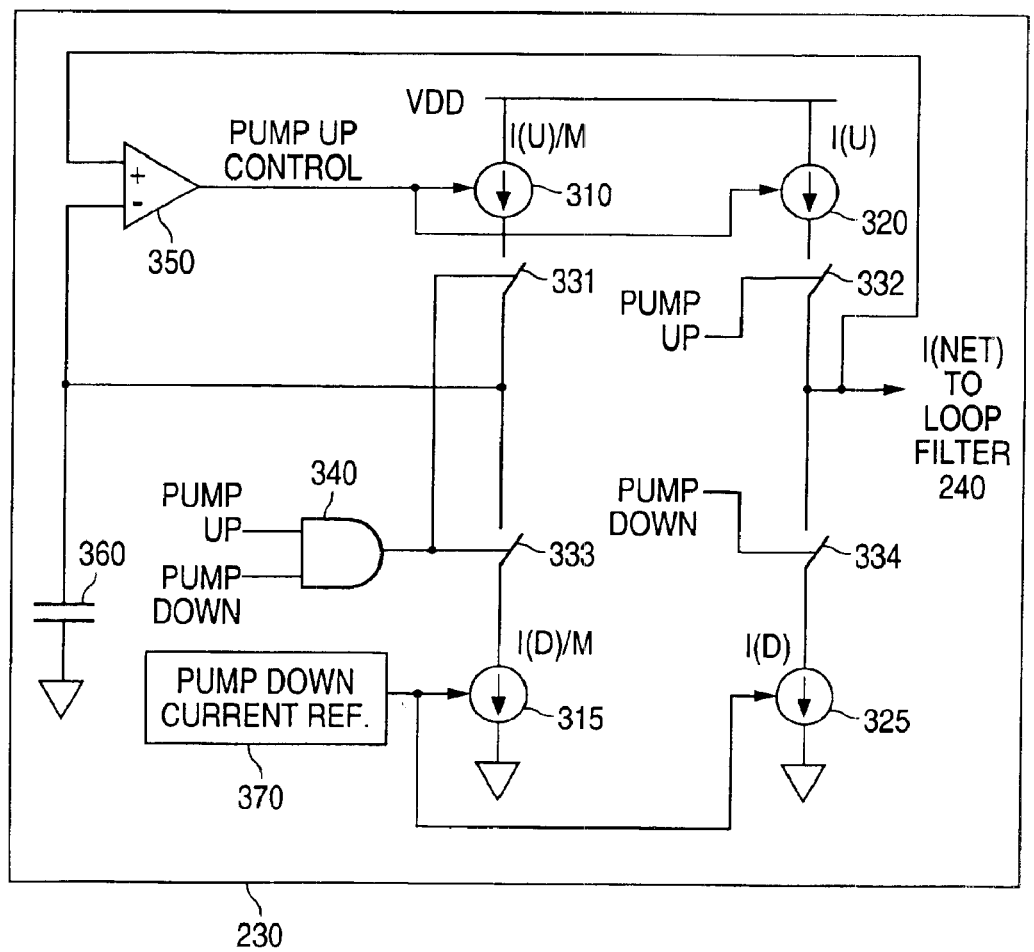
FIG. 3 illustrates selected portions of the charge current generating circuitry in the charge pump in the exemplary phase-locked loop according to one embodiment of the present invention.
Figure 2:
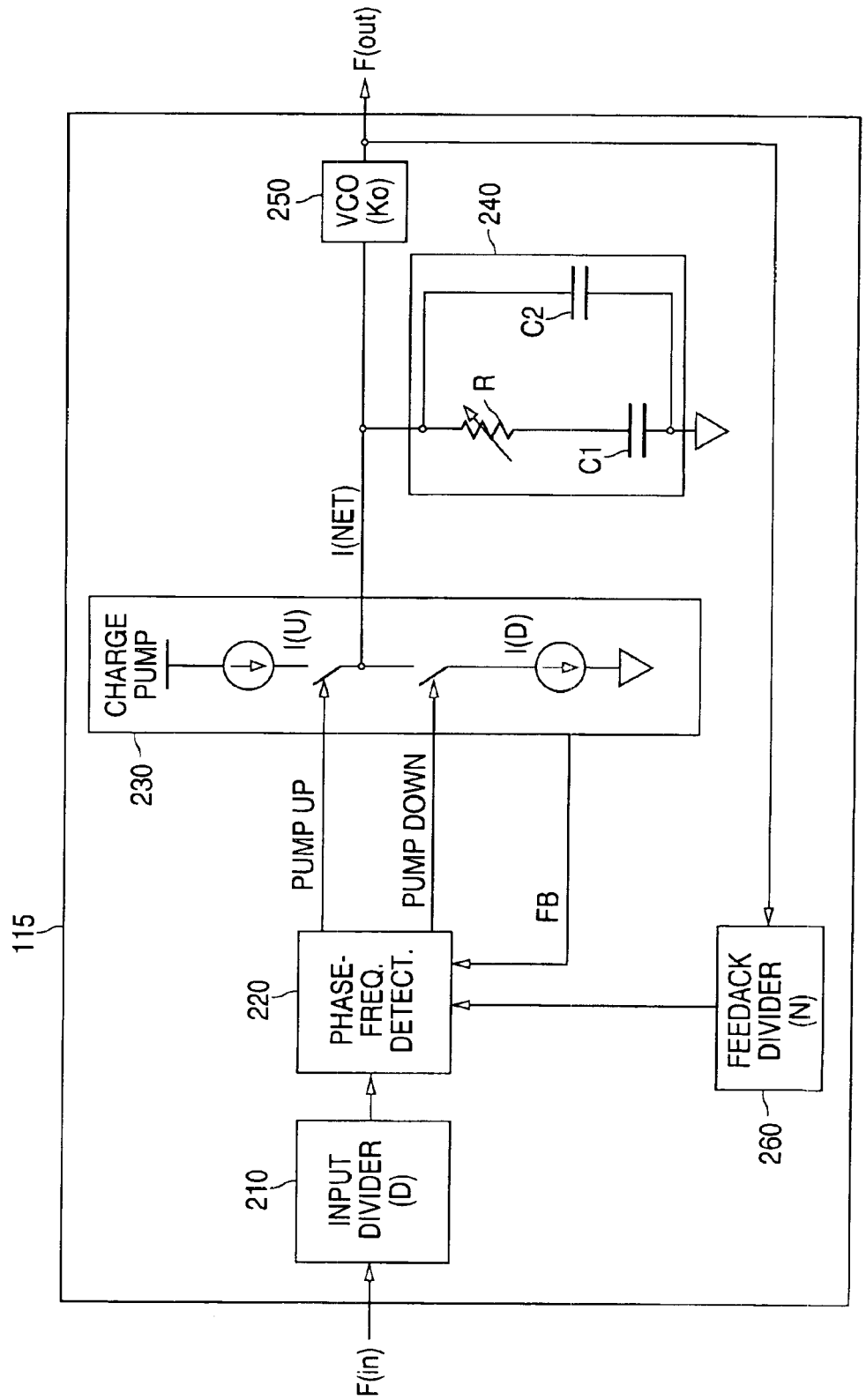
FIG. 2 illustrates the exemplary phase-locked loop frequency synthesizer in FIG. 1 in greater detail according to one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase locked loop or delay locked loop.

FIG. 1 illustrates exemplary system-on-a-chip (SOC) device 110 containing phase-locked-loop (PLL) 115 according to one embodiment of the present invention. SOC device 110 comprises phase-locked loop (PLL) frequency synthesizer 115, system control section 120, and system process section 125, which is capable of operating at a number of clock speeds and power is supply voltages. PLL frequency synthesizer 115 receives an incoming reference frequency signal, F(in), from an external crystal (X-TAL) oscillator 105. PLL frequency synthesizer 115 generates from the F(in) signal an output clock frequency signal, F(out), that is applied to system control section 120. The Fout clock signal can have a wide range of frequencies, depending on the task being performed by system control section 125.

FIG. 2 depicts exemplary phase-locked loop (PLL) frequency synthesizer 115 in FIG. 1 in greater detail according to one embodiment of the present invention. PLL frequency synthesizer 115 comprises input divider circuit 210, phase-frequency detector 220, charge pump 230, loop filter 240, voltage controlled oscillator (VCO) 250, and feedback divider circuit 260. Input divider circuit 210 divides the frequency of the F(in) reference clock frequency received from crystal oscillator 105 by the value D. The divided-by-D output clock signal from input divider circuit 210 forms one input to phase-frequency detector 220. The other input to phase-frequency detector 220 is the output of feedback divider circuit 260, which divides the frequency of the PLL output clock signal, F(out), by the value N.

Phase-frequency detector 220 compares the phase and frequency of the divided-by-D output clock signal from input divider circuit 210 and the divided-by-N output clock signal from feedback divider circuit 260 and generates either a Pump Up signal or a Pump Down signal, depending on whether the divided-by-N output clock signal from feedback divider circuit 260 is faster than or slower than the divided-by-D output clock signal from input divider circuit 210. If the divided-by-N output clock signal is too slow, phase-frequency detector 220 generates a Pump Up signal, which closes the top switch in charge pump 230 and injects the charge current I(U) onto capacitor C1 (through variable resistor R) and capacitor C2 in loop filter 240. If only the Pump Up signal is enabled, the current I(NET) onto loop filter 240 is equal to the charge current I(U). If the divided-by-N output clock signal is too fast, phase-frequency detector 220 generates a Pump Down signal, which closes the bottom switch in charge pump 230 and drains the charge current I(D) from capacitors C1 and C2 in loop filter 240. If only the Pump Down signal is enabled, the current I(NET) onto loop filter 240 is equal to the charge (or sink) current I(D).

The voltage on C2 is the input control voltage for VCO 250. As the voltage on C2 increases, the frequency of the output signal F(out) of VCO 250 also increases, thereby speeding up the divided-by-N output clock signal from feedback divider 260. As the voltage on C2 decreases, the frequency of the output signal F(out) of VCO 250 also decreases, thereby slowing down the divided-by-N output clock signal from feedback divider 260.

By way of example, the input signal, F(in), may be equal to 10 MHz, and the input divider value D may be 4. Thus, one input to phase-frequency detector 220 receives a 2.5 MHz signal from input divider 210. Also, the output signal, F(out), may be equal to 50 MHz and the feedback divider value N may be 20. Thus, the other input to phase-frequency detector 220 receives a 2.5 MHz signal from feedback divider 260.

A charge pump PLL, such as the one in FIG. 2, is a negative feedback system that ensures that the phase as well as the frequency at the input of phase-frequency detector 220 is (near) zero under steady state conditions. A PLL in such a state is said to be in the "lock" state. As noted above, to avoid what is known as the "dead zone problem", both the Pump Up current source and the Pump Down current source of charge pump 230 are turned ON simultaneously for a brief period at the end of each cycle of phase-frequency detector 220. When the Pump Up and Pump Down signals are both ON (enabled), a feedback signal, FB, is generated by charge pump 230. The FB signal disables the Pump Up and Pump Down signals from phase-frequency detector 220. This ensures that the simultaneous ON times of the Pump Up and Pump Down signals in the lock state is minimized in order to reduce charge pump output noise.

It is also desirable that the I(U) current and the I(D) current be identical during the lock state so that the I(NET) current is zero during the lock state. However, as noted above, it is difficult ensure that the I(U) current and the I(D) current are identical because of transistor devices used in the Pump Up and Pump Down current sources are different channel type device with different parasitic characteristics. Thus, I(NET) is typically non-zero in the lock state. The overall loop gain will drive towards zero net charge into the loop filter, compensating for this difference in pump currents with phase error. This phase error causes a small charging and discharging of loop filter 240, resulting in a periodic glitch that causes frequency spurs on VCO 250 output. To avoid this, the present invention provides a control circuit for balancing the I(U) and I(D) charging and discharging (sinking) currents in charge pump 230.

FIG. 3 illustrates selected portions of the charge current generating circuitry in charge pump 230 in exemplary phase-locked loop 115 according to an exemplary embodiment of the present invention. The block diagram functionality shows switches to depict the enabling and disabling function of the current sources and signal paths. However, those skilled in the art will readily understand that this enabling and disabling function may be accomplished by a number of different methods other than switches. Charge pump 230 comprises current source 310, current source 315, current source 320, current source 325, switched 331–334, AND gate 340, amplifier 350, integration capacitor 360, and Pump Down current reference 370.

The Pump Up signal controls switch 332 and the Pump Down signal controls switch 334. The Pump Up signal and the Pump Down signal together control switches 331 and 333 through AND gate 340. When the Pump Up signal is enabled (i.e., Logic 1) and the Pump Down signal is disabled (i.e., Logic 0), switch 332 is closed and switches 331, 333 and 334 are open. In this state, the Pump Up current I(U) charges loop filter 240 and I(U) and I(NET) are the same. When the Pump Down signal is enabled (i.e., Logic 1) and the Pump Up signal is disabled (i.e., Logic 0), switch 334 is closed and switches 331, 332 and 333 are open. In this state, the Pump Down current I(D) discharges loop filter 240 and I(D) and I(NET) are the same.

However, at the end of each cycle of phase-frequency detector 220, the Pump Up and Pump Down signals are enabled simultaneously for a brief period in order to eliminate the dead zone problem when in the lock state. When the Pump Up and Pump Down signals are both Logic 1, switches 331–334 are all ON. Amplifier 350, integrator capacitor 360 and current sources 310 and 315 are provided to correct the current and overall charge imbalance between I(U) and I(D).

The Pump Up Control signal controls current sources 310 and 320. Current sources 310 and 320 comprise transistor devices that are identical in all respects except that the size of current source 320 is scaled by a factor of M with respect to the size of current source 310. Typically, M is greater than 1. Thus, for the same Pump Up Control signal, current source 320 produces a current I(U) and current source 310 produces a current I(U)/M.

Similarly, the output voltage of Pump Down current reference 370 controls current sources 315 and 325. Current sources 315 and 325 comprise transistor devices that are identical in all respects except that the size of current source 325 is scaled by a factor of M with respect to the size of current source 315. M is the same scale factor as for current sources 310 and 320. Thus, for the same output voltage on Pump Down current reference 370, current source 325 produces a current I(D) and current source 315 produces a current I(D)/M.

During the dead-zone period when the Pump Up and Pump Down signals are both Logic 1, AND gate closes switches 331 and 333. If current sources 310 and 315 are not identical, there will be a net charge injected into the integrator capacitor. Closing is switches 331 and 333 samples this mismatch and causes the current difference between the I(U)/M current and the I(D)/M current to flow onto integrator capacitor 360. Amplifier 350 compares the difference between the voltage on capacitor 360 and the voltage on loop filter 240 and adjusts the Pump Up control signal to minimize this voltage difference.

By way of example, if the I(U)/M current (or charge transferred) is slightly greater than the I(D)/M current (or charge transferred), then a small amount of current (or net charge) will flow onto integrator capacitor 360. This will increase the voltage on the inverting input of amplifier 350 and reduce the Pump Up control signal. The change in the Pump Up control signal reduces the I(U)/M current in current source 310 until the total charge delivered by the I(U)/M current source is equal to the total charged delivered by the I(D)/M current source. This is known as the charge balance condition. Since I(U) current source 320 mirrors I(U)/M current source 310 by a factor M, any change in the I(U)/M current (or charge transferred) is proportionally reflected in the I(U) current (or charge transferred). So, as the I(U)/M current or transferred charge is reduced, the I(U) current or transferred charge is also reduced.

Also, the I(D) current (or transferred charge) in current source 325 mirrors the I(D)/M current (or transferred charge) in current source 315 by factor of M. As the I(U) current (or transferred charge) is reduced, the difference between I(U) current (or transferred charge) and the I(D) current (or transferred charge) is also reduced and the voltage on loop filter 240 is reduced. This charge balancing function ensures that the total charge delivered to loop filter 240 is zero during the lock condition.

Although the present invention has been described with several embodiments, various changes and modifications may be suggested to one skilled in the art. It is intended that the present invention encompass such changes and modifications as fall within the scope of the appended claims.

What is claimed is:

1. A charge pump, comprising:
   a first current source capable of injecting a first charging current onto a loop filter;
   a second current source capable of draining a first discharging current from the loop filter;
   a third current source capable of injecting a second charging current onto an integrator capacitor and a fourth current source capable of draining a second discharging current from the integrator capacitor; and
   a circuit capable of detecting a voltage difference between a voltage on the loop filter and a voltage on the integrator capacitor, the circuit further capable of controlling the first and third current sources to at least partially reduce the voltage difference.

2. The charge pump of claim 1, wherein:
the first and third current sources form a first current mirror, wherein the first charging current mirrors the second charging current by a factor of M; and
the second and fourth current sources form a second current mirror, wherein the first discharging current mirrors the second discharging current by the factor of M.

3. The charge pump of claim 1, further comprising:
a first switch capable of coupling the first current source to the loop filter, the first switch capable of being controlled by a first control signal; and
a second switch capable of coupling the second current source to the loop filter, the second switch capable of being controlled by a second control signal.

4. The charge pump of claim 3, further comprising:
a third switch capable of coupling the third current source to the integrator capacitor;
a fourth switch capable of coupling the fourth current source to the integrator capacitor; and
an AND gate capable of receiving the first and second control signals, the third and fourth switches capable of being controlled by an output of the AND gate.

5. The charge pump of claim 1, wherein the circuit comprises an amplifier having inputs coupled to the integrator capacitor and the loop filter.

6. The charge pump of claim 1, further comprising a current reference capable of controlling the second and fourth current sources.

7. A circuit, comprising:
at least one of a phase locked loop and a delay locked loop, at least one of the phase locked loop and the delay locked loop comprising a charge pump;
the charge pump comprising:
    a first current source capable of injecting a first charging current onto a loop filter
    a second current source capable of draining a first discharging current from the loop filter;
    a third current source capable of injecting a second charging current onto an integrator capacitor and a fourth current source capable of draining a second discharging current from the integrator capacitor; and
    a circuit capable of detecting a voltage difference between a voltage on the loop filter and a voltage on the integrator capacitor, the circuit further capable of controlling the first and third current sources to at least partially reduce the voltage difference.

8. The circuit of claim 7, wherein:
the first and third current sources form a first current mirror, wherein the first charging current mirrors the second charging current by a factor of M; and
the second and fourth current sources form a second current mirror, wherein the first discharging current mirrors the second discharging current by the factor of M.

9. The circuit of claim 7, wherein the charge pump further comprises:
a first switch capable of coupling the first current source to the loop filter, the first switch capable of being controlled by a first control signal; and
a second switch capable of coupling the second current source to the loop filter, the second switch capable of being controlled by a second control signal.

10. The circuit of claim 9, wherein the charge pump further comprises:
a third switch capable of coupling the third current source to the integrator capacitor;
a fourth switch capable of coupling the fourth current source to the integrator capacitor; and
an AND gate capable of receiving the first and second control signals, the third and fourth switches capable of being controlled by an output of the AND gate.

11. The circuit of claim 7, wherein the circuit comprises an amplifier having inputs coupled to the integrator capacitor and the loop filter.

12. The circuit of claim 7, wherein the charge pump further comprises a current reference capable of controlling the second and fourth current sources.

13. The circuit of claim 9, wherein the phase locked loop further comprises:
a voltage controlled oscillator capable of generating an output signal;
an input divider capable of receiving an input signal and dividing the input signal by a first value;
a feedback divider capable of dividing the output signal by a second value; and
a phase frequency detector capable of comparing the divided input signal and the divided output signal and generating the first and second control signals.

14. The circuit of claim 13, further comprising:
an oscillator capable of providing the input signal to the input divider in the phase locked loop;
a system control section; and
a system process section.

15. A method, comprising:
coupling a first charging current from a first current source to a loop filter to at least partially charge the loop filter;
coupling a first discharging current from a second current source to the loop filter to at least partially discharge the loop filter;
coupling a second charging current from a third current source and a second discharging current from a fourth current source to an integrator capacitor;
detecting a voltage difference between a voltage on the loop filter and a voltage on the integrator capacitor; and
adjusting at least one of the first and third current sources to at least partially reduce the voltage difference.

16. The method of claim 15, wherein:
the first and third current sources form a first current mirror, wherein the first charging current mirrors the second charging current by a factor of M; and
the second and fourth current sources form a second current mirror, wherein the first discharging current mirrors the second discharging current by the factor of M.

17. The method of claim 15, wherein:
coupling the first charging current to the loop filter comprises closing a first switch coupled to the first current source and the loop filter; and
coupling the first discharging current to the loop filter comprises closing a second switch coupled to the second current source and the loop filter.

18. The method of claim 17, wherein coupling the second charging current and the second discharging current to the integrator capacitor comprises:
closing a third switch coupled to the third current source and the integrator capacitor, and closing a fourth switch coupled to the fourth current source and the integrator capacitor.

19. The method of claim 18, wherein closing the first, second, third, and fourth switches comprises:

closing the first switch based on a first control signal;

closing the second switch based on a second control signal; and closing the third and fourth switches based on the first and second control signals.

20. The method of claim 19, further comprising controlling the second and fourth current sources using a current reference.

* * * * *

UNITED STATES PATENT AND TRADEMARK OFFICE
CERTIFICATE OF CORRECTION

PATENT NO.   : 6,897,692 B1
DATED        : May 24, 2005
INVENTOR(S)  : Rodney A. Hughes It is certified that error appears in the above-identified patent and that said Letters Patent is hereby corrected as shown below:

Title page,
Item [57], ABSTRACT,
Line 9, delete "is" after "discharging";

Column 1,
Line 8, insert -- TECHNICAL FIELD OF THE INVENTION--;
Line 43, delete "is" after "also";

Column 3,
Line 22, delete "town" and replace with -- two --;

Column 6,
Line 17, delete "is" after "Closing".

Signed and Sealed this

Seventh Day of February, 2006

JON W. DUDAS
*Director of the United States Patent and Trademark Office*